US012563959B2

(12) United States Patent
Choi et al.

(10) Patent No.: US 12,563,959 B2
(45) Date of Patent: Feb. 24, 2026

(54) METHOD OF MANUFACTURING DISPLAY DEVICE

(71) Applicant: Samsung Display Co., LTD., Yongin-si (KR)

(72) Inventors: Jonghoon Choi, Yongin-si (KR); Hiroshi Okumura, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 402 days.

(21) Appl. No.: 18/225,294

(22) Filed: Jul. 24, 2023

(65) Prior Publication Data

US 2024/0107868 A1     Mar. 28, 2024

(30) Foreign Application Priority Data

Sep. 27, 2022     (KR) ........................ 10-2022-0122384

(51) Int. Cl.
*H10K 71/20*          (2023.01)
*H10K 59/12*          (2023.01)
*H10K 59/121*         (2023.01)

(52) U.S. Cl.
CPC ....... *H10K 71/233* (2023.02); *H10K 59/1201* (2023.02); *H10K 59/1213* (2023.02)

(58) Field of Classification Search
None
See application file for complete search history.

(56) References Cited

U.S. PATENT DOCUMENTS

| | | | | |
|---|---|---|---|---|
| 5,294,811 A | * | 3/1994 | Aoyama | ............ H10D 30/6743 |
| | | | | 257/E29.147 |
| 6,197,625 B1 | * | 3/2001 | Choi | .................. H10D 30/6715 |
| | | | | 257/E21.414 |
| 2012/0146037 A1 | * | 6/2012 | Okabe | .................. H10D 30/674 |
| | | | | 257/E21.414 |

FOREIGN PATENT DOCUMENTS

| | | | | | |
|---|---|---|---|---|---|
| CN | 102386069 A | * | 3/2012 | ....... | H01L 21/02532 |
| CN | 102629558 A | * | 8/2012 | | |
| JP | H0851075 A | * | 2/1996 | | |
| KR | 950013429 B1 | * | 11/1995 | ........ | H10D 30/6731 |
| KR | 1020040092529 A | | 2/2006 | | |
| KR | 100761346 B1 | | 9/2007 | | |
| KR | 20100069480 A | * | 6/2010 | ........ | H10F 71/1221 |
| KR | 101030031 B1 | | 4/2011 | | |
| KR | 20170034496 A | * | 3/2017 | ....... | H01L 21/02667 |
| KR | 1020200058622 A | | 5/2020 | | |

* cited by examiner

*Primary Examiner* — Michael Lebentritt
(74) *Attorney, Agent, or Firm* — CANTOR COLBURN LLP

(57)          ABSTRACT

A method of manufacturing a display device includes forming a first amorphous silicon layer on a substrate on which a first area and a second area are defined, forming a mask in the second area on the first amorphous silicon layer, forming a preliminary second amorphous silicon layer on the first amorphous silicon layer and the mask, forming a second amorphous silicon layer by removing a portion of the preliminary second amorphous silicon layer on the mask, removing the mask, and forming a polycrystalline silicon layer by crystallizing the first amorphous silicon layer and the second amorphous silicon layer.

20 Claims, 21 Drawing Sheets

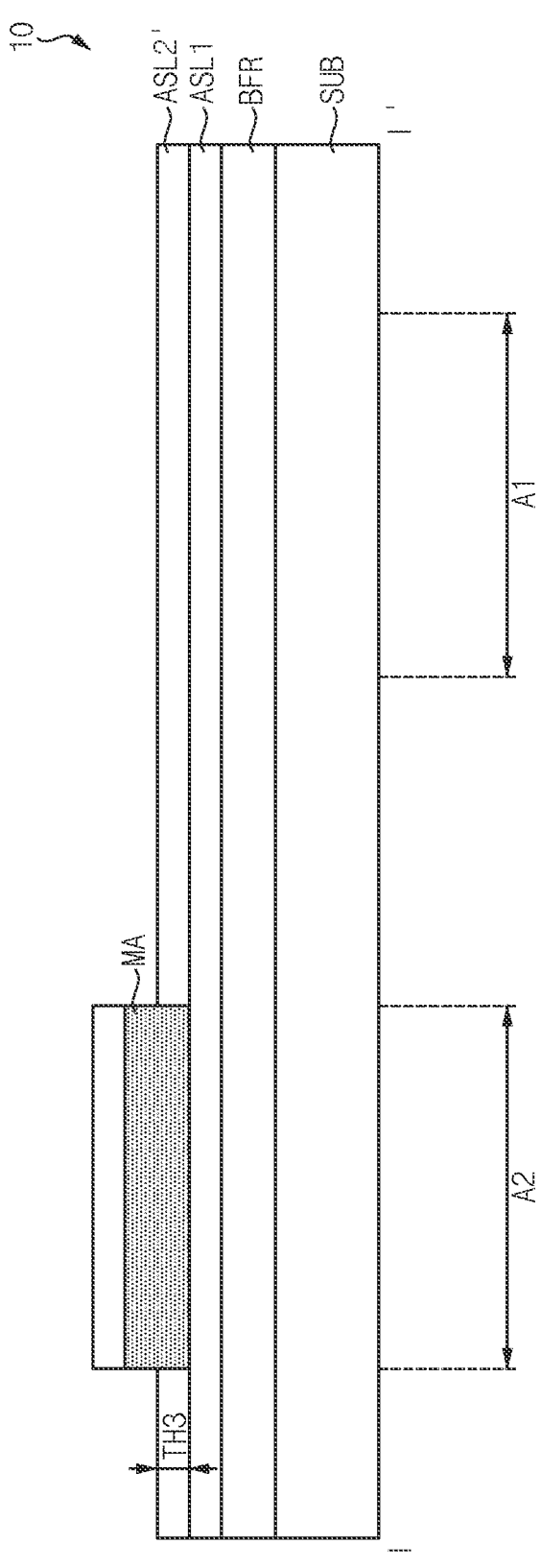
F I G. 5

F I G. 6
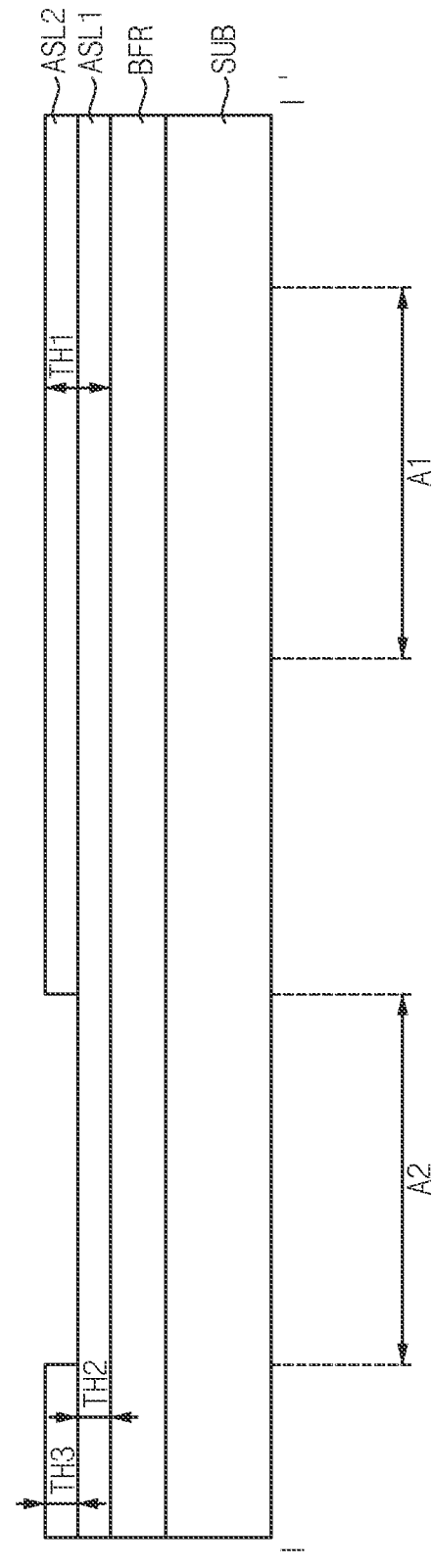

F I G. 7
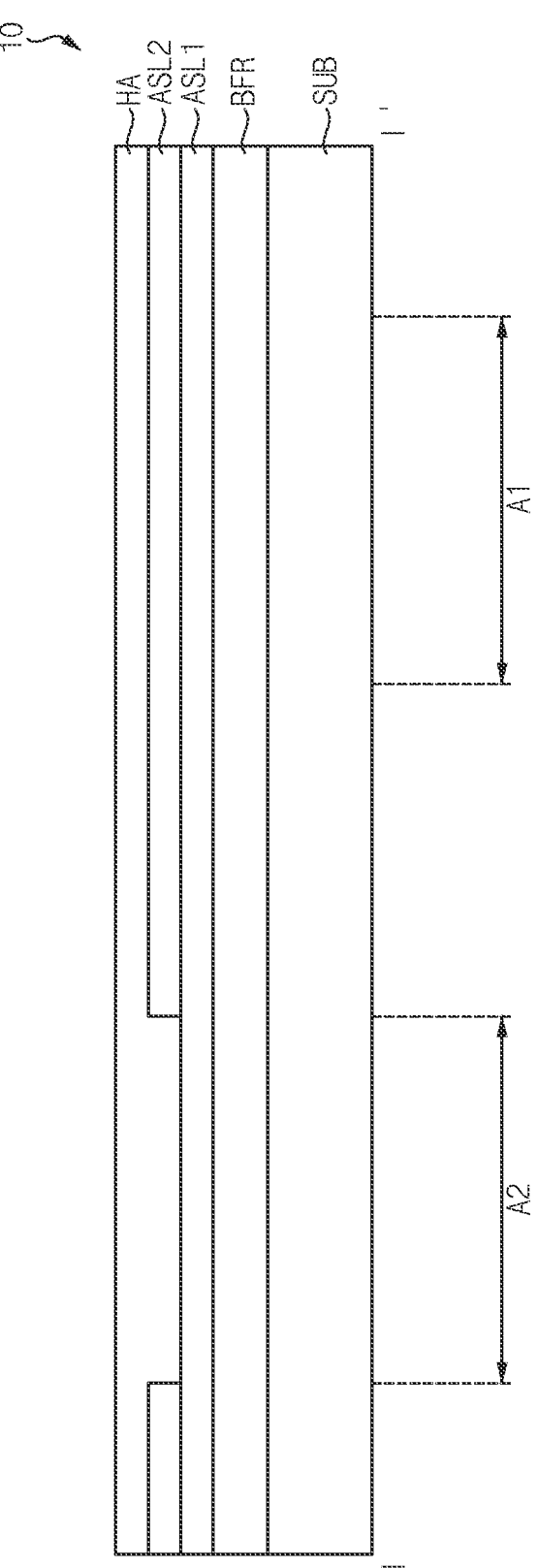

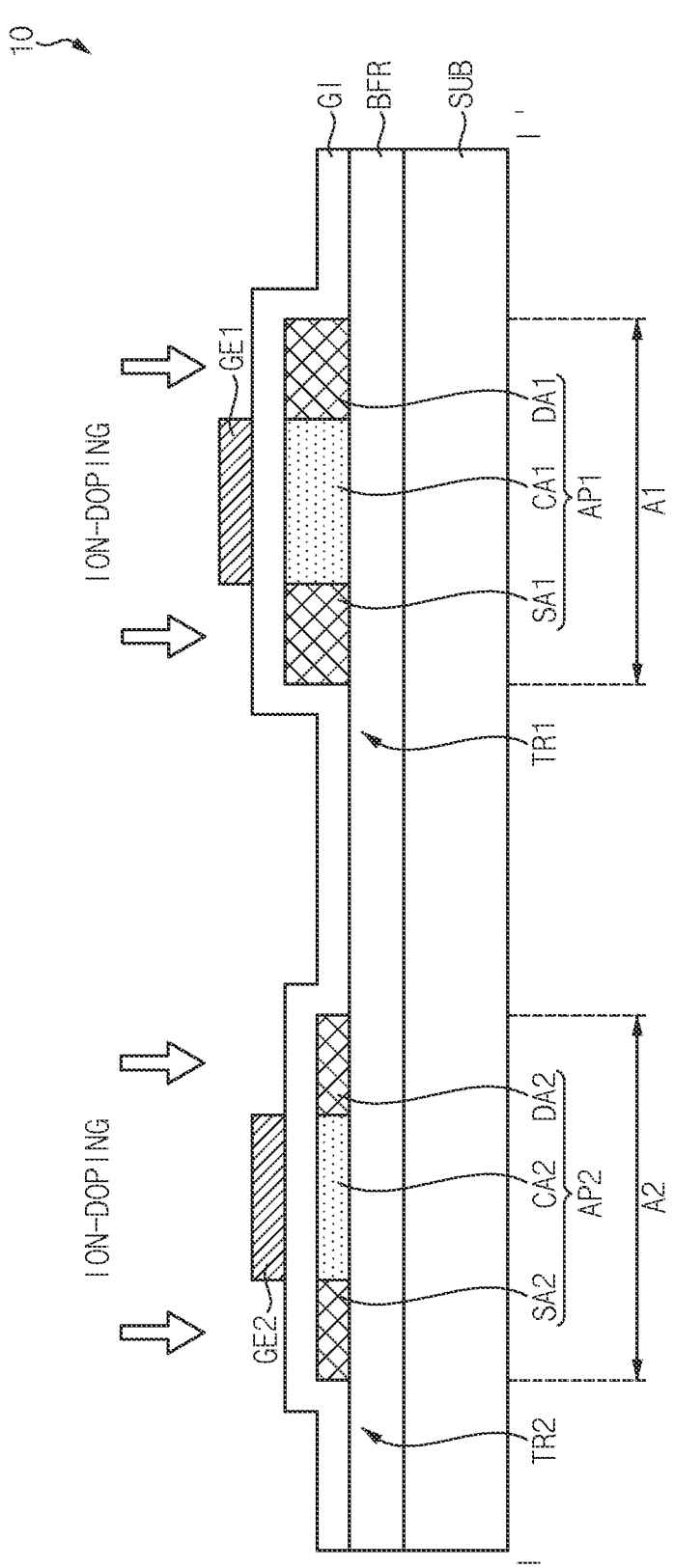
F I G. 10

METHOD OF MANUFACTURING DISPLAY DEVICE

This application claims priority to Korean Patent Application No. 10-2022-0122384, filed on Sep. 27, 2022, and all the benefits accruing therefrom under 35 U.S.C. § 119, the content of which in its entirety is herein incorporated by reference.

BACKGROUND

1. Field

Embodiments relate to a method of manufacturing a display device. More specifically, embodiments relate to a method of manufacturing a display device providing visual information.

2. Description of the Related Art

A display device may include a light emitting diode that emits light to display an image. The light emitting diode may include electrodes facing each other and a light emitting layer disposed therebetween.

The display device may further include a plurality of transistors including a driving transistor, a switching transistor, or the like to provide driving current to the light emitting diode. The driving transistor and the switching transistor may have different characteristics from each other.

SUMMARY

Embodiments provide a method of manufacturing a display device with improved display quality.

A method of manufacturing a display device according to an embodiment of the present disclosure includes forming a first amorphous silicon layer on a substrate on which a first area and a second area are defined, forming a mask in the second area on the first amorphous silicon layer, forming a preliminary second amorphous silicon layer on the first amorphous silicon layer and the mask, forming a second amorphous silicon layer by removing a portion of the preliminary second amorphous silicon layer on the mask, removing the mask, and forming a polycrystalline silicon layer by crystallizing the first amorphous silicon layer and the second amorphous silicon layer.

In an embodiment, a thickness of the second amorphous silicon layer may be less than about 200 angstroms (Å).

In an embodiment, a sum of a thickness of the first amorphous silicon layer and a thickness of the second amorphous silicon layer may be in a range of about 300 Å to about 500 Å.

In an embodiment, a thickness of the mask may be greater than or equal to a thickness of the second amorphous silicon layer.

In an embodiment, the method may further include cleaning the first amorphous silicon layer and the second amorphous silicon layer.

In an embodiment, the portion of the preliminary second amorphous silicon layer on the mask and the mask may be simultaneously removed.

In an embodiment, the method may further include forming a first polycrystalline silicon pattern and a second polycrystalline silicon pattern in the first area and the second area, respectively, by etching an area of the polycrystalline silicon layer except for areas corresponding to the first area and the second area, respectively.

In an embodiment, the method may further include forming a gate insulating layer on the substrate to cover the first polycrystalline silicon pattern and the second polycrystalline silicon pattern.

In an embodiment, the method may further include forming a first gate electrode overlapping the first polycrystalline silicon pattern and a second gate electrode overlapping the second polycrystalline silicon on the gate insulating layer.

In an embodiment, the method may further include forming a buffer layer on the substrate.

A method of manufacturing a display device according to an embodiment of the present disclosure includes forming a first amorphous silicon layer on a substrate on which a first area and a second area are defined, forming a photoresist layer on the first amorphous silicon layer, exposing the first amorphous silicon layer overlapping the first area by patterning the photoresist layer, forming a preliminary second amorphous silicon layer on the first amorphous silicon layer and a patterned photoresist layer, forming a second amorphous silicon layer by removing a portion of the preliminary second amorphous silicon layer on the patterned photoresist layer, removing the patterned photoresist layer, and forming a polycrystalline silicon layer by crystallizing the first amorphous silicon layer and the second amorphous silicon layer.

In an embodiment, a thickness of the second amorphous silicon layer may be less than about 200 Å.

In an embodiment, a sum of a thickness of the first amorphous silicon layer and a thickness of the second amorphous silicon layer may be in a range of about 300 Å to about 500 Å.

In an embodiment, the method may further include cleaning the first amorphous silicon layer and the second amorphous silicon layer.

In an embodiment, the portion of the preliminary second amorphous silicon layer on the patterned photoresist layer and the photoresist layer may be simultaneously removed.

In an embodiment, the method may further include forming a first polycrystalline silicon pattern and a second polycrystalline silicon pattern in the first area and the second area, respectively, by etching an area of the polycrystalline silicon layer except for areas overlapping the first area and the second area, respectively.

In an embodiment, the method may further include forming a gate insulating layer on the substrate to cover the first polycrystalline silicon pattern and the second polycrystalline silicon pattern.

In an embodiment, the method may further include forming a first gate electrode overlapping the first polycrystalline silicon pattern and a second gate electrode overlapping the second polycrystalline silicon pattern on the gate insulating layer.

In an embodiment, the method may further include forming a buffer layer on the substrate.

In an embodiment, the photoresist layer may be a negative-type photoresist layer.

In a display device according to embodiments of the disclosure, as an active pattern of a driving transistor is formed to have a greater thickness than a thickness of an active pattern of a switching transistor, hysteresis and ADR of the driving transistor may decrease, and off current of the switching transistor may decrease. Accordingly, characteristics of the driving transistor and the switching transistor having different functions may be improved.

In such embodiments, a process of forming the active pattern of the driving transistor and the active pattern of the switching transistor having different thicknesses from each other is performed without using a wet etching process, a stain problem caused by the wet etching process may be effectively prevented from occurring. Accordingly, display quality of the display device may be improved.

BRIEF DESCRIPTION OF THE DRAWINGS

FIGS. 3, 4, 5, 6, 7, 8, 9, 10 and 11 are cross-sectional views showing an embodiment of a method of manufacturing the display device of FIG. 1.

DETAILED DESCRIPTION

Figure 1:
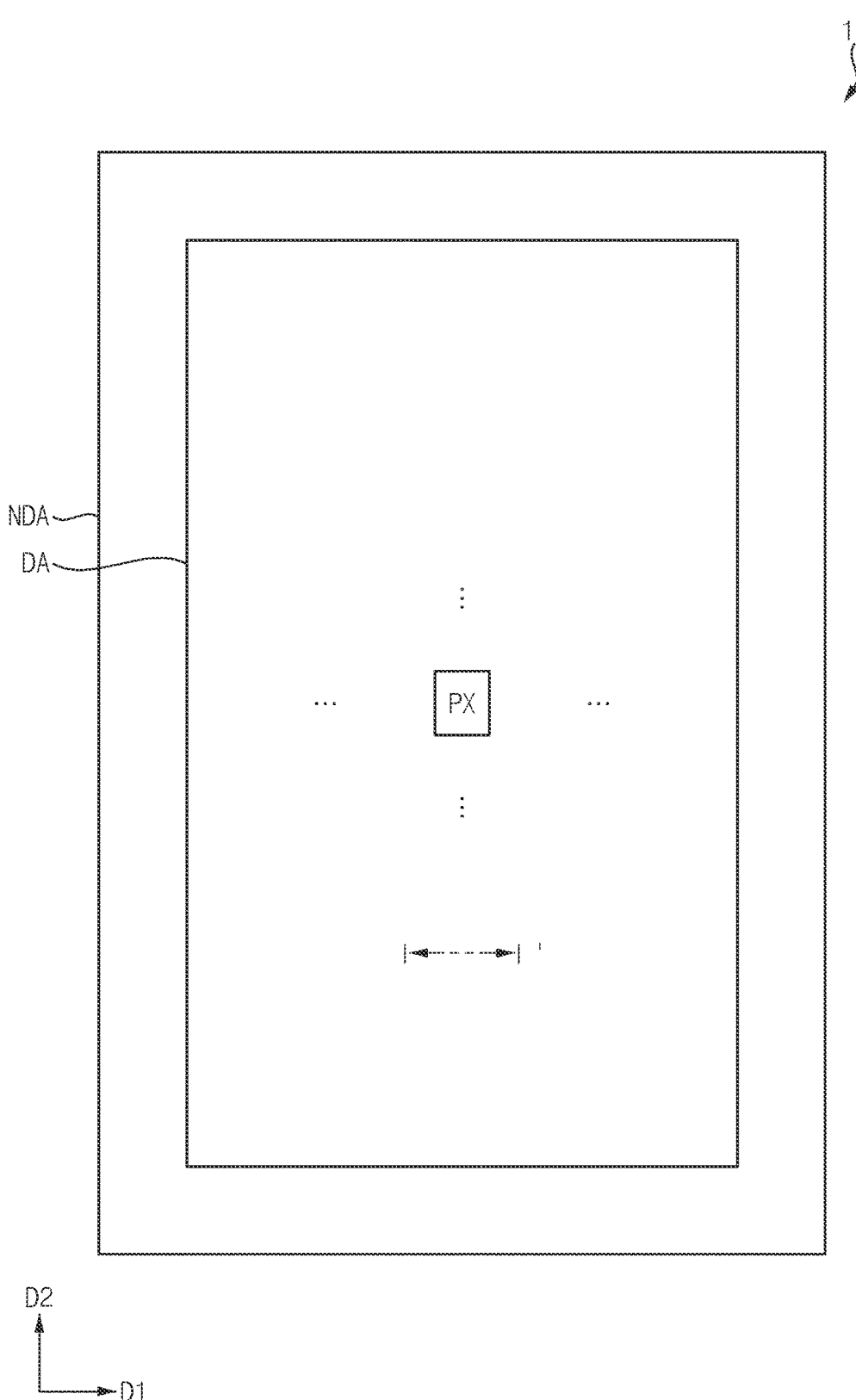
FIG. 1 is a schematic plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings. The same reference numerals are used for the same components in the drawings, and any repetitive detailed descriptions of the same components will be omitted or simplified.

FIG. 1 is a schematic plan view of a display device according to an embodiment.

Referring to FIG. 1, an embodiment of a display device 10 may include a display area DA and a non-display area NDA. The display area DA may be an area in which an image is displayed. A planar shape of the display area DA may be a rectangular shape. However, the planar shape of the display area DA is not limited thereto, and the display area DA may have various planar shapes such as a circular shape, an elliptical shape, a polygonal shape, or the like.

The non-display area NDA may be disposed around the display area DA. The non-display area NDA may surround the display area DA. The non-display area NDA may be an area in which no image is displayed. In an embodiment, drivers for displaying an image of the display area DA may be disposed in the non-display area NDA.

Pixels PX may be arranged in a matrix in the display area DA. Signal lines such as a gate line and a data line may be disposed in the display area DA. The signal lines such as the gate line and the data line may be connected to each of the pixels PX. Each of the pixels PX may receive a gate signal, a data signal, or the like from the signal lines.

Figure 2:
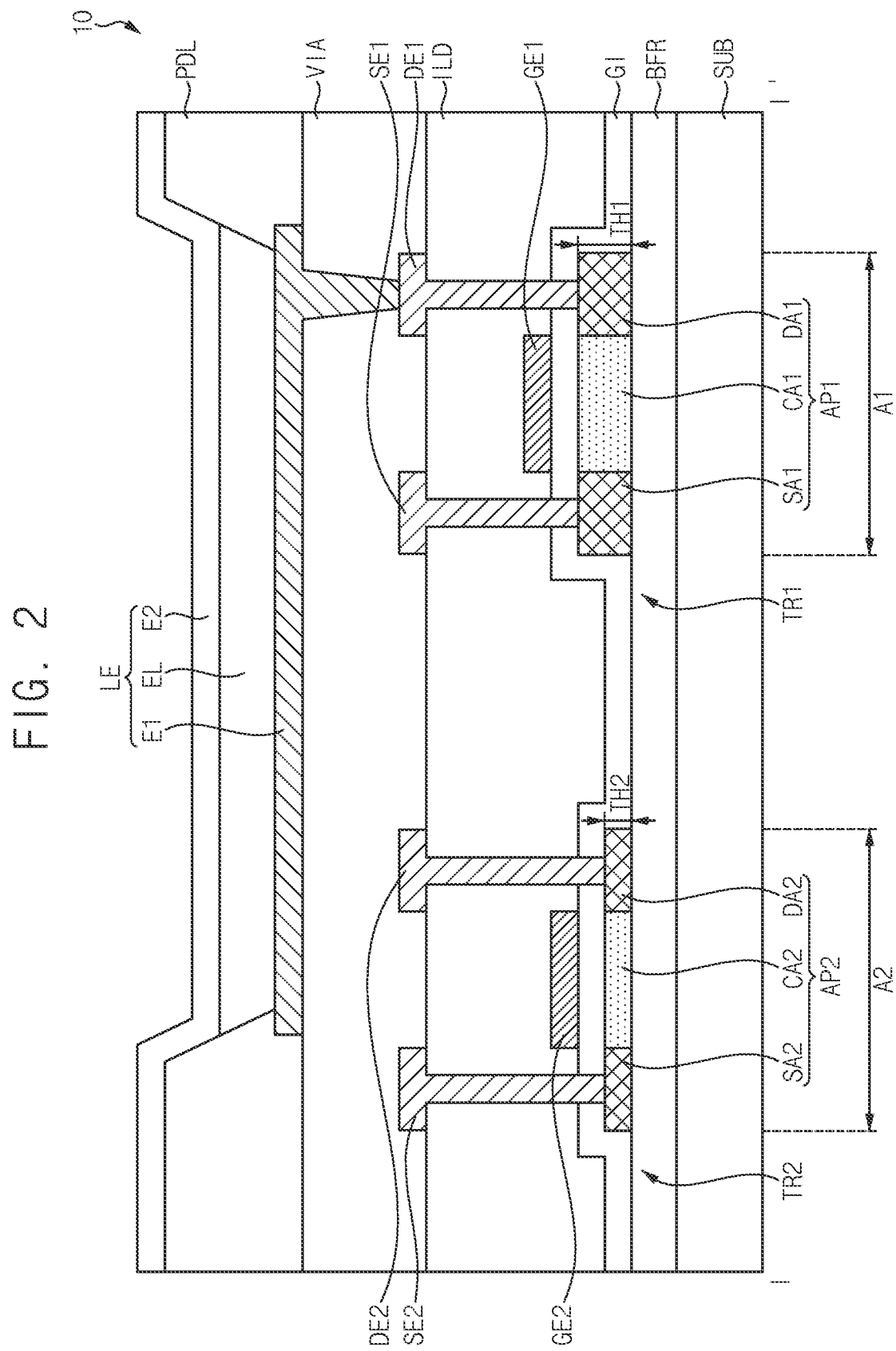
FIG. 2 is a cross-sectional view taken along line I-I' of FIG. 1.

FIG. 2 is a cross-sectional view taken along line I-I' of FIG. 1.

Referring to FIG. 2, the display device 10 according to an embodiment may include a substrate SUB, a buffer layer BFR, a first active pattern AP1, a second active pattern AP2, a gate insulating layer GI, a first gate electrode GE1, a second gate electrode GE2, an interlayer insulating layer ILD, a first source electrode SE1, a first drain electrode DE1, a second source electrode SE2, a second drain electrode DE2, a via insulating layer VIA, a first electrode E1, a pixel defining layer PDL, a light emitting layer EL, and a second electrode E2.

The substrate SUB may include a transparent material or an opaque material. In an embodiment, for example, the substrate SUB may include glass, quartz, plastic, or the like. These may be used alone or in combination with each other.

The buffer layer BFR may be disposed on the substrate SUB. In an embodiment, the buffer layer BFR may include an inorganic material. In an embodiment, for example, the buffer layer BFR may include silicon oxide, silicon nitride, silicon oxynitride, or the like. These may be used alone or in combination with each other. The buffer layer BFR may prevent metal atoms or impurities from penetrating into the first active pattern AP1 and second active pattern AP2. In addition, the buffer layer BFR may control a heat supply rate during a crystallization process for forming the first active pattern AP1 and the second active pattern AP2.

The first active pattern AP1 and the second active pattern AP2 may be disposed on the buffer layer BFR. In an embodiment, each of the first active pattern AP1 and the second active pattern AP2 may include a silicon semiconductor material. In an embodiment, for example, each of the first active pattern AP1 and the second active pattern AP2 may include amorphous silicon, polycrystalline silicon, or the like. These may be used alone or in combination with each other.

The first active pattern AP1 may include a first source area SA1, a first drain area DA1, and a first channel area CA1 disposed between the first source area SA1 and the first drain area DA1. The second active pattern AP2 may include a second source area SA2, a second drain area DA2, and a second channel area CA2 disposed between the second source area SA2 and the second drain area DA2.

In an embodiment, the first active pattern AP1 may have a first thickness TH1, and the second active pattern AP2 may have a second thickness TH2 less than the first thickness TH1. In an embodiment, for example, the first thickness TH1 may be a vertical distance (or a distance in a thickness direction of the substrate SUB) from a lower surface of the first active pattern AP1 to an upper surface of the first active pattern AP1, and the second thickness TH2 may be a vertical distance from a lower surface of the second active pattern AP2 to an upper surface of the second active pattern AP2.

In an embodiment, a value obtained by subtracting the second thickness TH2 from the first thickness TH1 may be greater than zero (0) angstrom (Å) and less than about 200 Å. In an embodiment, the first thickness TH1 may be in a range of about 300 Å to about 500 Å.

The gate insulating layer GI may be disposed on the buffer layer BFR, and may cover the first active pattern AP1 and the second active pattern AP2. In an embodiment, the gate insulating layer GI may include an inorganic insulating material. In an embodiment, for example, the gate insulating layer GI may include silicon oxide, silicon nitride, silicon oxynitride, or the like. These may be used alone or in combination with each other.

The first gate electrode GE1 and the second gate electrode GE2 may be disposed on the gate insulating layer GI. The first gate electrode GE1 may overlap the first active pattern AP1 in the thickness direction, and the second gate electrode GE2 may overlap the second active pattern AP2 in the thickness direction. Specifically, the first gate electrode GE1 may overlap the first channel area CA1 in the thickness direction, and the second gate electrode GE2 may overlap the second channel area CA2 in the thickness direction. In an embodiment, each of the first gate electrode GE1 and the second gate electrode GE2 may include a conductive material. In an embodiment, for example, each of the first gate electrode GE1 and the second gate electrode GE2 may include aluminum, platinum, palladium, silver, magnesium, gold, nickel, neodymium, iridium, chromium, lithium, calcium, molybdenum, titanium, tungsten, copper, or the like. These may be used alone or in combination with each other.

The first active pattern AP1 and the first gate electrode GE1 may form (or collectively define or constitute) a first transistor TR1. The second active pattern AP2 and the second gate electrode GE2 may form a second transistor TR2. In an embodiment, the first transistor TR1 may function as a driving transistor for generating a driving current, and the second transistor TR2 may function as a switching transistor for providing a data signal to the first transistor TR1. In an embodiment, for example, the second transistor TR2 may include or be defined by a plurality of transistors connected to each other.

The interlayer insulating layer ILD may be disposed on the gate insulating layer GI, and may cover the first gate electrode GE1 and the second gate electrode GE2. In an embodiment, the interlayer insulating layer ILD may include an inorganic insulating material. In an embodiment, for example, the interlayer insulating layer ILD may include silicon oxide, silicon nitride, silicon oxynitride, or the like. These may be used alone or in combination with each other.

The first source electrode SE1, the first drain electrode DE1, the second source electrode SE2, and the second drain electrode DE2 may be disposed on the interlayer insulating layer ILD. Each of the first source electrode SE1, the first drain electrode DE1, the second source electrode SE2, and the second drain electrode DE2 may include a conductive material. In an embodiment, for example, each of the first source electrode SE1, the first drain electrode DE1, the second source electrode SE2, and the second drain electrode DE2 may include aluminum, platinum, palladium, silver, magnesium, gold, nickel, neodymium, iridium, chromium, lithium, calcium, molybdenum, titanium, tungsten, copper, or the like. These may be used alone or in combination with each other.

The first source electrode SE1 may be connected to the first source area SA1 through a contact hole defined through (e.g., formed by removing a first portion of) the gate insulating layer GI and the interlayer insulating layer ILD. The first drain electrode DE1 may be connected to the first drain area DA1 through a contact hole defined through (e.g., formed by removing a second portion of) the gate insulating layer GI and the interlayer insulating layer ILD. The second source electrode SE2 may be connected to the second source area SA2 through a contact hole defined through (e.g., formed by removing a third portion of) the gate insulating layer GI and the interlayer insulating layer ILD. The second drain electrode DE2 may be connected to the second drain area DA2 through a contact hole defined through (e.g., formed by removing a fourth portion of) the gate insulating layer GI and the interlayer insulating layer ILD.

The via insulating layer VIA may be disposed on the interlayer insulating layer ILD, and may cover the first source electrode SE1, the first drain electrode DE1, the second source electrode SE2, and the second drain electrode DE2. The via insulating layer VIA may include an organic insulating material. In an embodiment, for example, the via insulating layer VIA may include photoresist, polyacrylic resin, polyimide resin, acrylic resin, or the like. These may be used alone or in combination with each other.

The first electrode E1 may be disposed on the via insulating layer VIA. The first electrode E1 may be connected to the first drain electrode DE1 through a contact hole defined through (e.g., formed by removing a portion of) the via insulating layer VIA. The first electrode E1 may include a conductive material. In an embodiment, for example, the first electrode E1 may include aluminum, platinum, palladium, silver, magnesium, gold, nickel, neodymium, iridium, chromium, lithium, calcium, molybdenum, titanium, tungsten, copper, indium tin oxide, indium zinc oxide, or the like. These may be used alone or in combination with each other.

The pixel defining layer PDL may be disposed on the via insulating layer VIA. An opening exposing at least a portion of an upper surface of the first electrode E1 may be defined in the pixel defining layer PDL. The pixel defining layer PDL may include an organic insulating material. In an embodiment, for example, the pixel defining layer PDL may include photoresist, polyacrylic resin, polyimide resin, acrylic resin, or the like. These may be used alone or in combination with each other.

The light emitting layer EL may be disposed on the first electrode E1. Specifically, the light emitting layer EL may be disposed on the first electrode E1 exposed by the opening of the pixel defining layer PDL. The light emitting layer EL may include or be formed of an organic material, and may emit light of a predetermined color.

The second electrode E2 may be disposed on the light emitting layer EL. In an embodiment, the second electrode E2 may also be disposed on the pixel defining layer PDL. The second electrode E2 may include a conductive material. In an embodiment, for example, the second electrode E2 may include aluminum, platinum, silver, magnesium, gold, chromium, tungsten, titanium, or the like. These may be used alone or in combination with each other. The first electrode E1, the light emitting layer EL, and the second electrode E2 may form a light emitting diode LE. The light emitting diode LE may emit light based on the driving current transmitted from the first transistor TR1.

A thickness of the first active pattern AP1 may be related to a characteristic of the first transistor TR1, and a thickness of the second active pattern AP2 may be related to a characteristic of the second transistor TR2. For example, as the thickness of the first active pattern AP1 increases, hysteresis and ADR of the first transistor TR1 may decrease, and instantaneous afterimage of the display device 10 may be improved. For example, as the thickness of the second active pattern AP2 decreases, off current of the second transistor TR2 may decrease.

Here, the hysteresis may mean a difference between a threshold voltage (V t h) of the first transistor TR1 during forward swing and a threshold voltage (V t h) of the first transistor TR1 during reverse swing. The ADR may mean a difference between a driving range of the first transistor TR1 during forward swing and a driving range of the first transistor TR1 during reverse swing. The off current may mean a leakage current flowing through the second transistor TR2 when the second transistor TR2 is turned off.

In a case where the thickness of the first active pattern AP1 and the thickness of the second active pattern AP2 are substantially the same as each other, either one of the characteristic of the first transistor TR1 and the characteristic of the second transistor TR2 may be lowered or deteriorated. Specifically, in a case where the thickness of the first active pattern AP1 and the thickness of the second active pattern AP2 are relatively large, the characteristic of the first transistor TR1 may be improved by decreasing the hysteresis and the ADR of the first transistor TR1, but the characteristic of the second transistor TR2 may deteriorate by increasing the off current of the second transistor TR2. In addition, in a case where the thickness of the first active pattern AP1 and the thickness of the second active pattern AP2 are relatively small, the characteristic of the second transistor TR2 may be improved by decreasing the off current of the second transistor TR2, but the characteristic of the first transistor TR1 may deteriorate by increasing the hysteresis and the ADR of the first transistor TR1.

In the display device 10 according to an embodiment, the first thickness TH1 of the first active pattern AP1 is greater than the second thickness TH2 of the second active pattern AP2, such that the hysteresis and the ADR of the first transistor TR1 may decrease, and the off current of the second transistor TR2 may decrease. Accordingly, the characteristic of the first transistor TR1 and the characteristic of the second transistor TR2 may be respectively improved.

In such an embodiment, since a wet etching process is not used in a process of providing a height (or thickness) difference between the first thickness TH1 and the second thickness TH2, a stain problem that may be caused by the wet etching process may be improved. Accordingly, display quality of the display device 10 may be improved.

FIGS. 3, 4, 5, 6, 7, 8, 9, 10 and 11 are cross-sectional views showing an embodiment of a method of manufacturing the display device of FIG. 1.

Figure 3:
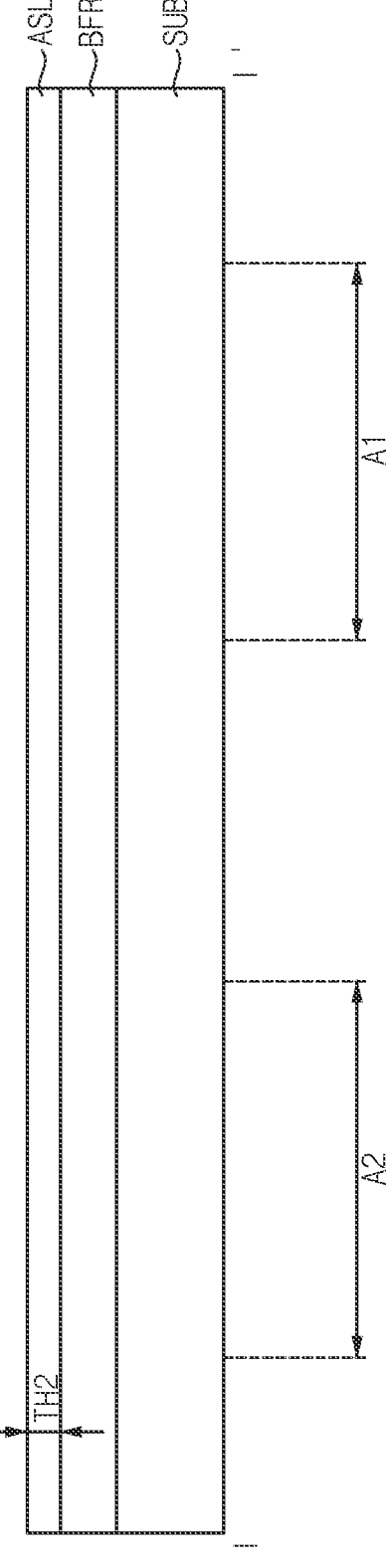

Referring to FIGS. 2 and 3, the buffer layer BFR may be formed on the substrate SUB. A first area A1 and a second area A2 may be defined on the substrate SUB. The first area A1 may overlap or correspond to an area where the first active pattern AP1 is formed, and the second area A2 may overlap or correspond to an area where the second active pattern AP2 is formed.

A first amorphous silicon layer ASL1 may be formed on the buffer layer BFR. In an embodiment, the first amorphous silicon layer ASL1 may have the second thickness TH2.

Figure 4:
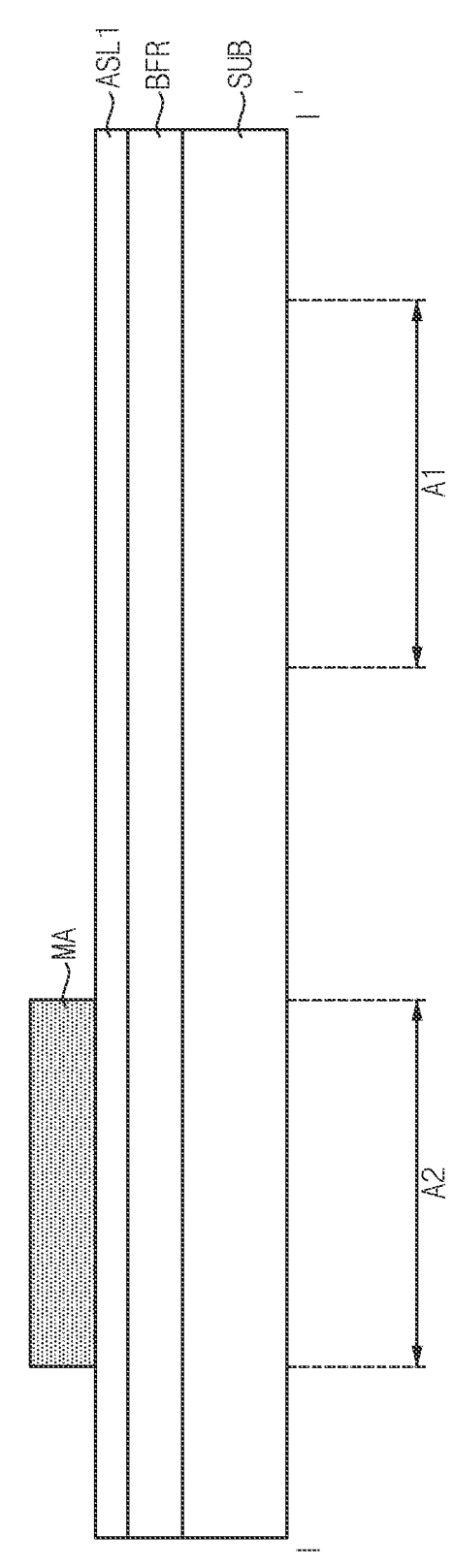

Referring to FIG. 4, a mask (or a mask layer) MA may be provided or formed on the first amorphous silicon layer ASL1. In an embodiment, the mask MA may be formed to overlap (or correspond to) the second area A2. In an embodiment, for example, the mask MA may include metal.

Referring to FIG. 5, a preliminary second amorphous silicon layer ASL2' may be formed on the first amorphous silicon layer ASL1 and the mask MA. The preliminary second amorphous silicon layer ASL2' may have a third thickness TH3. In an embodiment, the third thickness TH3 may be greater than 0 Å and less than about 200 Å. In an embodiment, a thickness of the mask MA may be greater than or equal to the third thickness TH3 that is the thickness of the preliminary second amorphous silicon layer ASL2'.

Referring to FIGS. 5 and 6, the preliminary second amorphous silicon layer ASL2' on the mask MA and the mask MA may be removed. In an embodiment, the preliminary second amorphous silicon layer ASL2' on the mask MA and the mask MA may be simultaneously removed. Accordingly, a second amorphous silicon layer ASL2 may be formed. In addition, the first amorphous silicon layer ASL1 overlapping the second area A2 may be exposed.

The second amorphous silicon layer ASL2 may have the same thickness as the preliminary second amorphous silicon layer ASL2'. That is, the second amorphous silicon layer ASL2 may have the third thickness TH3. In such an embodiment, the thickness of the mask MA may be greater than or equal to the third thickness TH3 that is the thickness of the second amorphous silicon layer ASL2. In an embodiment, the third thickness TH3 may be greater than 0 Å and less than about 200 Å.

The first thickness TH1 may be a sum of the second thickness TH2 of the first amorphous silicon layer ASL1 and the third thickness TH3 of the second amorphous silicon layer ASL2. In an embodiment, the first thickness TH1 may be in a range of about 300 Å to about 500 Å.

Referring to FIG. 7, the first amorphous silicon layer ASL1 overlapping the second area A2 and the second amorphous silicon layer ASL2 may be cleaned. In an embodiment, the first amorphous silicon layer ASL1 overlapping the second area A2 and the second amorphous silicon layer ASL2 may be cleaned using hydrofluoric acid HA. The hydrofluoric acid HA may be an aqueous solution in which hydrogen fluoride (HF) is dissolved. In an embodiment, for example, the hydrofluoric acid HA may include about 0.5% hydrogen fluoride. A natural oxide film formed on the first amorphous silicon layer ASL1 overlapping the second area A2 and the second amorphous silicon layer ASL2 may be removed by cleaning the first amorphous silicon layer ASL1 overlapping the second area A2 and the second amorphous silicon layer ASL2 with the hydrofluoric acid HA.

Figure 8:
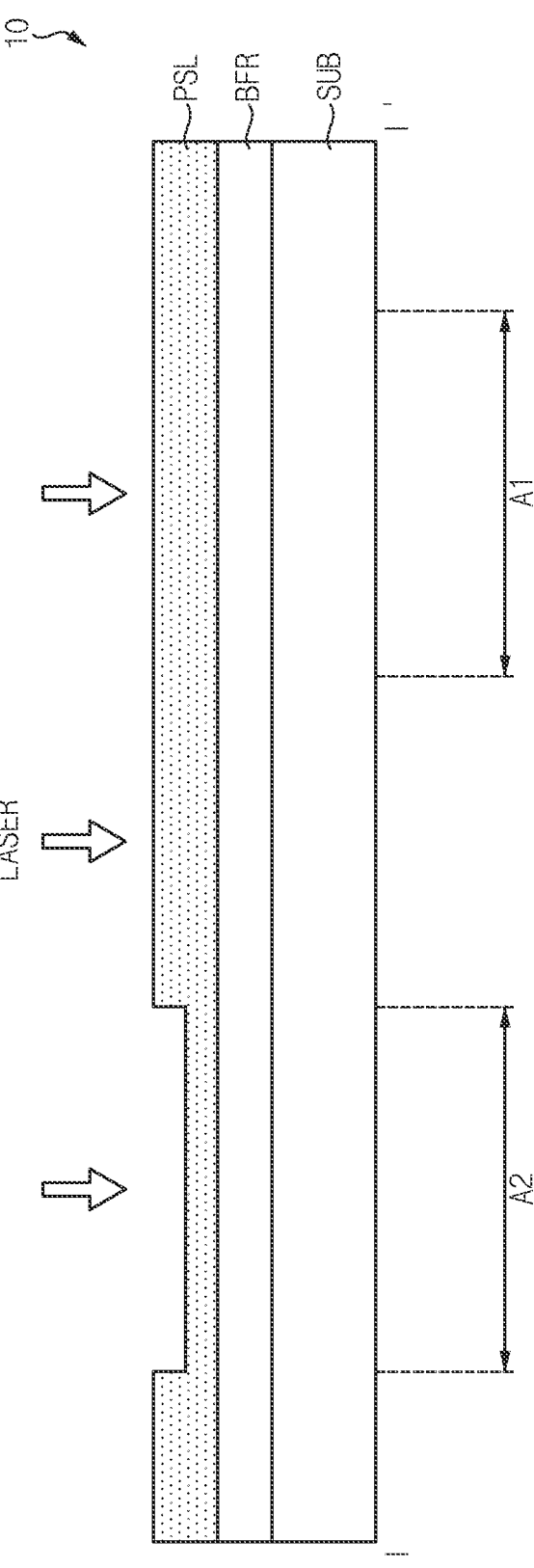

Referring to FIGS. 7 and 8, a polycrystalline silicon layer PSL may be formed by crystallizing the first amorphous silicon layer ASL1 and the second amorphous silicon layer ASL2. In an embodiment, the polycrystalline silicon layer PSL may be formed by radiating a laser to the first amorphous silicon layer ASL1 and the second amorphous silicon layer ASL2. In an embodiment, for example, the laser may be a short-wavelength, high-power, or high-efficiency excimer laser. In an embodiment, for example, the excimer laser may include an inert gas, an inert gas halide, a mercury halide, an inert gas oxide compound, a multiatomic excimer, or the like. In an embodiment, for example, the inert gas may be Are, $Kr_2$, $Xe_2$, and the like, the inert gas halide may be ArF, ArCl, KrF, KrCl, XeF, XeCl, or the like, the mercury halide may be HgCl, HgBr, HgI, and the like, the inert gas oxide compound may be ArO, KrO, XeO, or the like, and the multiatomic excimer may be $Kr_2F$, $Xe_2F$, or the like.

Figure 9:
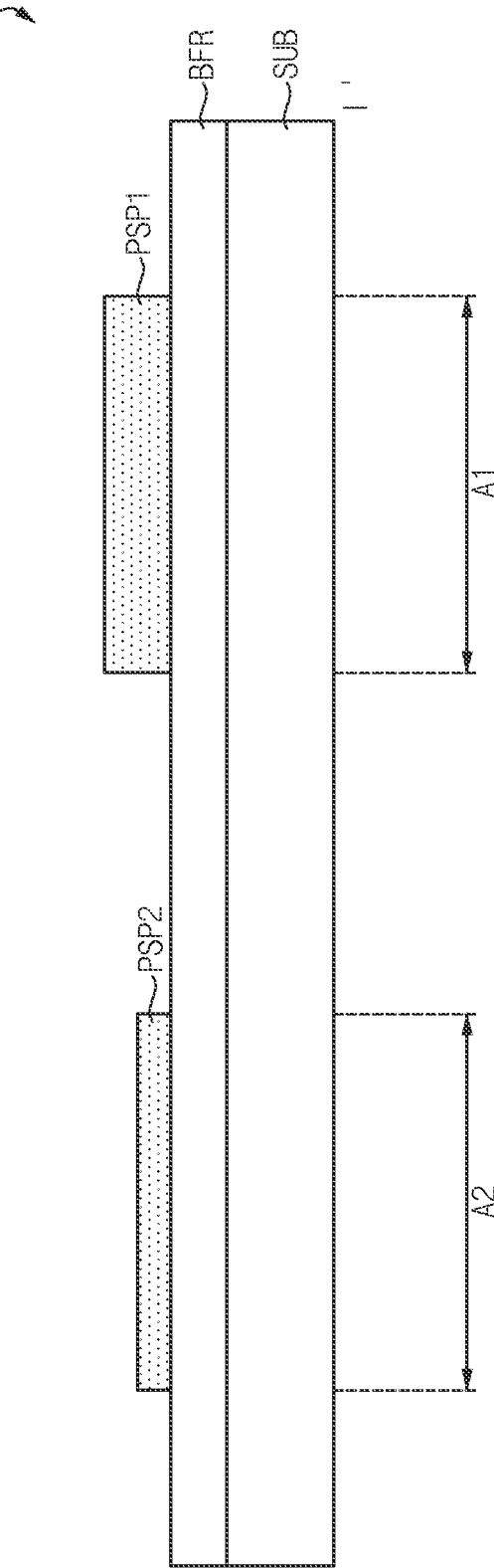

Referring to FIGS. 8 and 9, all area of the polycrystalline silicon layer PSL except for an area overlapping the first area A1 and an area overlapping the second area A2 may be etched. Specifically, in the polycrystalline silicon layer PSL, an area excluding an area overlapping the first area A1 and an area overlapping the second area A2 may be etched by the first thickness TH1. Accordingly, a first polycrystalline silicon pattern PSP1 overlapping the first area A1 and a second polycrystalline silicon pattern PSP2 overlapping the second area A2 may be formed.

Referring to FIGS. 9 and 10, the gate insulating layer GI may be formed on the buffer layer BFR to cover the first polycrystalline silicon pattern PSP1 and the second polycrystalline silicon pattern PSP2. The first gate electrode GE1 and the second gate electrode GE2 may be formed on the gate insulating layer GI. In an embodiment, the first gate electrode GE1 may be formed to overlap the first polycrystalline silicon pattern PSP1 in the thickness direction. The second gate electrode GE2 may be formed to overlap the second polycrystalline silicon pattern PSP2 in the thickness direction.

Ions may be implanted into the first polycrystalline silicon pattern PSP1 and the second polycrystalline silicon pattern PSP2 to form the first active pattern AP1 and the second active pattern AP2, respectively.

In an embodiment, for example, the first source area SA1 and the first drain area DA1 may be formed by implanting the ions into portions of the first active pattern AP1 that does not overlap the first gate electrode GE1. The first channel area CA1 in which the ions are not implanted may be formed in the first active pattern AP1 overlapping the first gate electrode GE1. In addition, the second source area SA2 and the second drain area DA2 may be formed by implanting the ions into portions of the second active pattern AP2 that does not overlap the second gate electrode GE2. The second channel area CA2 in which ions are not implanted may be formed in the second active pattern AP2 overlapping the second gate electrode GE2.

Figure 11:
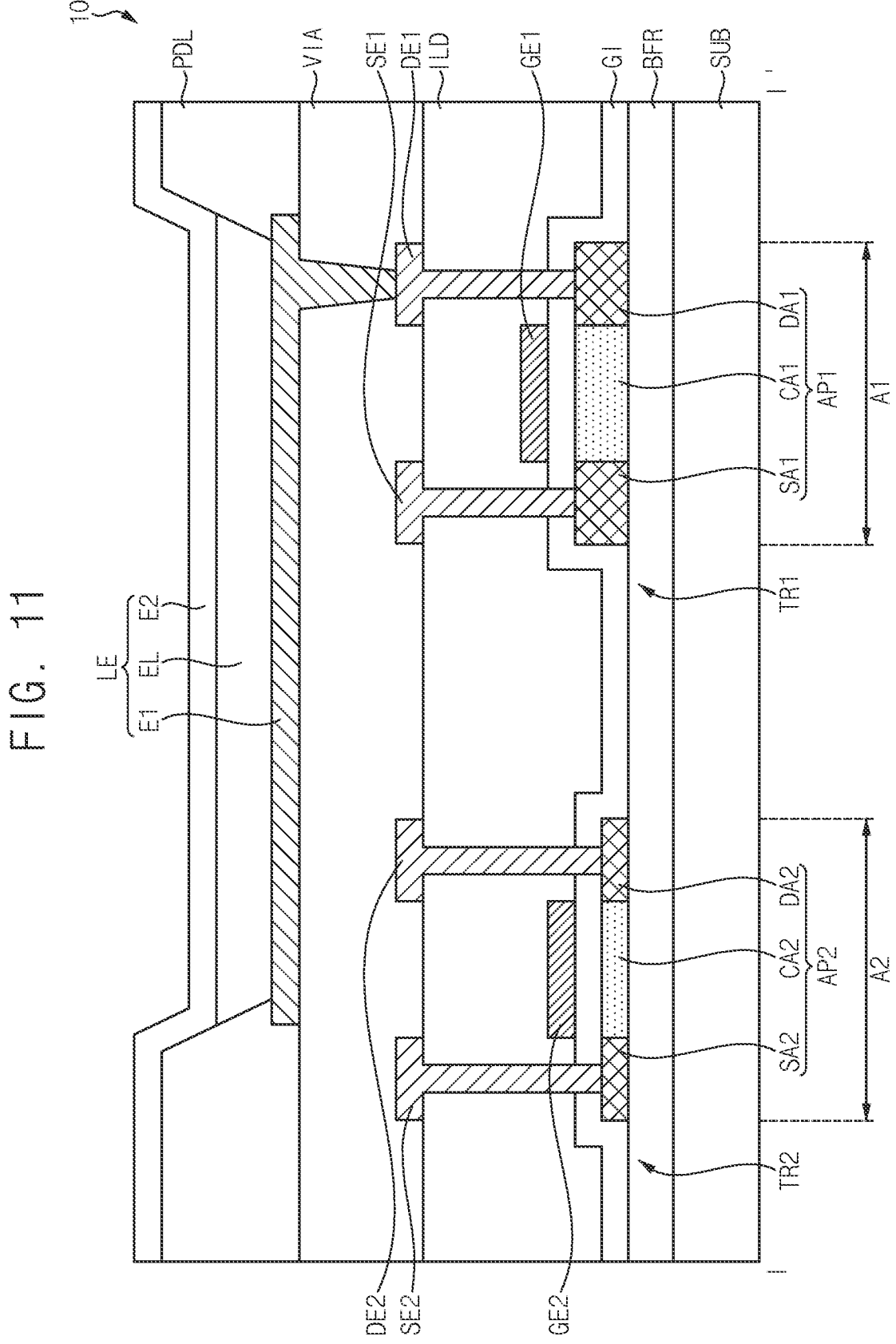

Referring to FIG. 11, the interlayer insulating layer ILD may be formed on the gate insulating layer GI to cover the first gate electrode GE1 and the second gate electrode GE2. Contact holes may be formed through the gate insulating layer GI and the interlayer insulating layer ILD. The contact holes may expose the first source area SA1, the first drain area DA1, the second source area SA2, and the second drain area DA2, respectively.

The first source electrode SE1, the first drain electrode DE1, the second source electrode SE2, and the second drain electrode DE2 may be formed on the interlayer insulating layer ILD. The first source electrode SE1, the first drain electrode DE1, the second source electrode SE2, and the second drain electrode DE2 may be connected to the first source area SA1, the first drain area DA1, the second source area SA2, and the second drain area DA2 through the contact holes, respectively.

The via insulating layer VIA may be formed on the interlayer insulating layer ILD to cover the first source electrode SE1, the first drain electrode DE1, the second source electrode SE2, and the second drain electrode DE2. Contact hole may be formed through the via insulating layer VIA, and the contact hole may expose the first drain electrode DE1.

The first electrode E1 may be formed on the via insulating layer VIA. The first electrode E1 may be connected to the first drain electrode DE1 through the contact hole.

The pixel defining layer PDL may be formed on the via insulating layer VIA. The opening exposing at least a portion of the first electrode E1 may be formed in the pixel defining layer PDL.

The light emitting layer EL may be formed on the first electrode E1. Specifically, the light emitting layer EL may be formed on the first electrode E1 exposed by the opening of the pixel defining layer PDL. The second electrode E2 may be formed on the light emitting layer EL.

Figure 12:
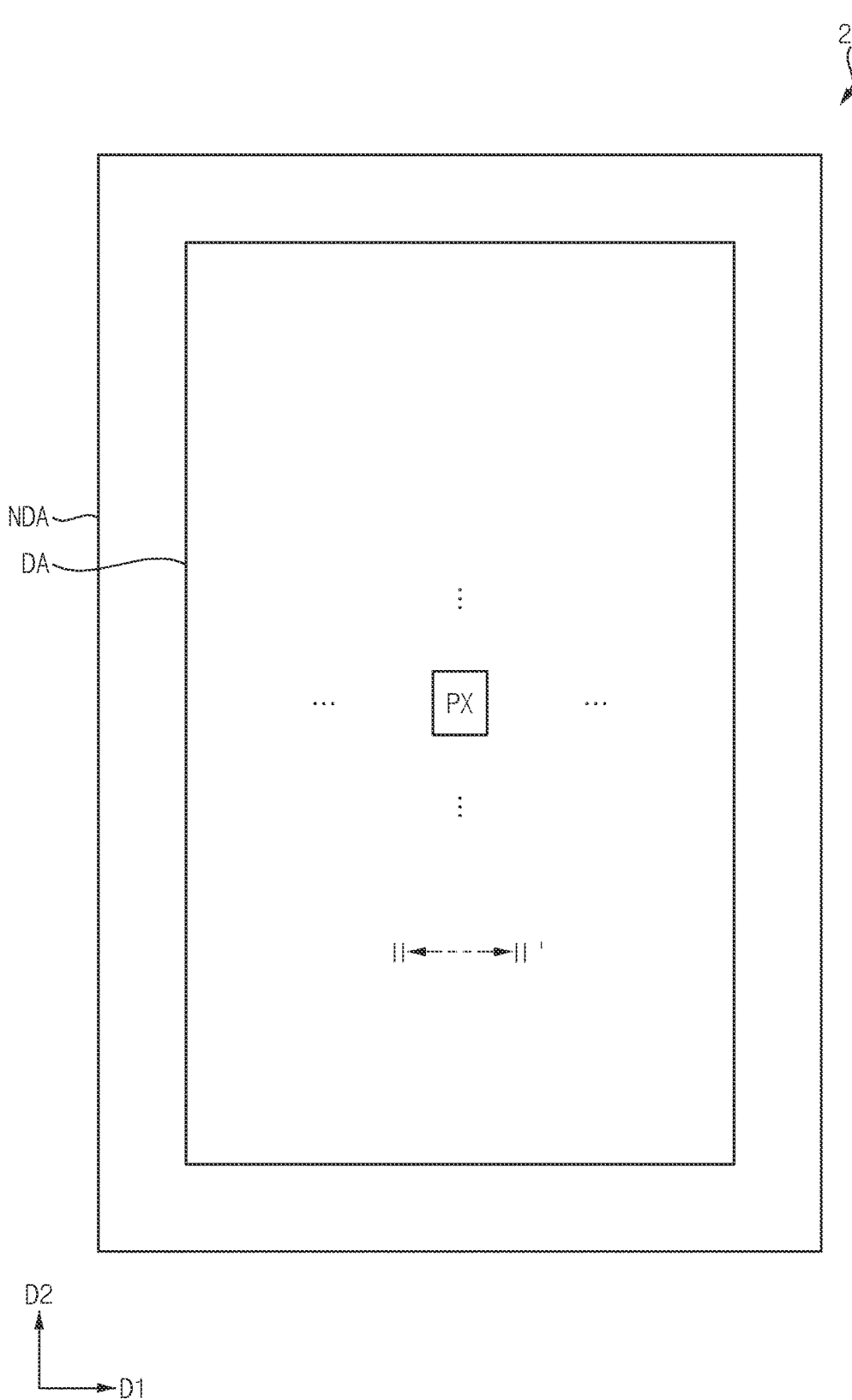
FIG. 12 is a schematic plan view of a display device according to an embodiment.
Figure 13:
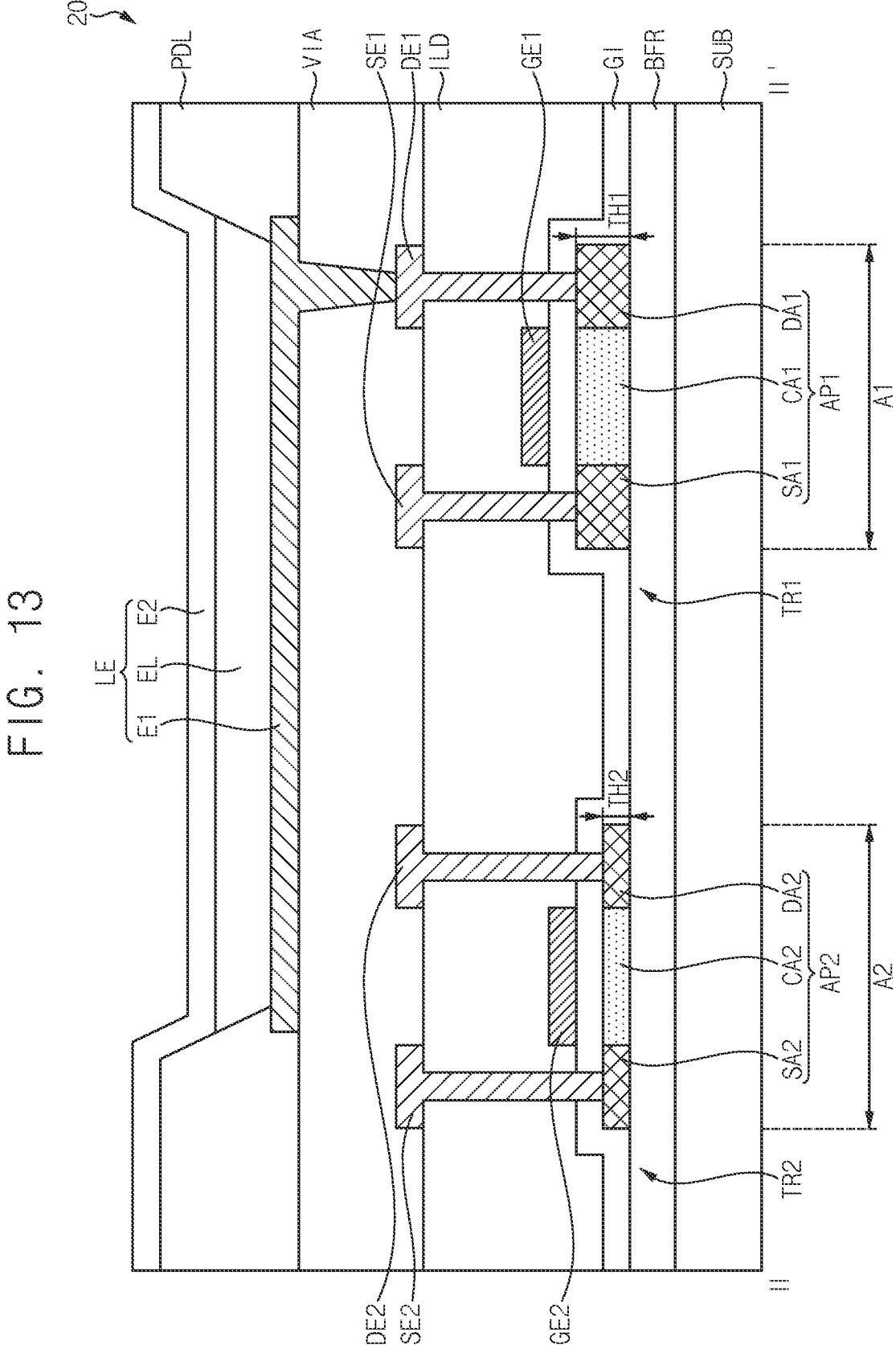
FIG. 13 is a cross-sectional view taken along line II-II' of FIG. 12.

FIG. 12 is a schematic plan view of a display device according to an embodiment. FIG. 13 is a cross-sectional view taken along line II-II' of FIG. 12.

Referring to FIGS. 12 and 13, a display device 20 according to an embodiment of the disclosure may include a substrate SUB, a buffer layer BFR, a first active pattern AP1, a second active pattern AP2, a gate insulating layer GI, a first gate electrode GE1, a second gate electrode GE2, an interlayer insulating layer ILD, a first source electrode SE1, a first drain electrode DE1, a second source electrode SE2, a second drain electrode DE2, a via insulating layer VIA, a first electrode E1, a pixel defining layer PDL, a light emitting layer EL, and a second electrode E2. The display device 20 shown in FIGS. 12 and 13 may be substantially the same as or similar to the display device 10 described above with reference to FIGS. 1 and 2 except for a manufacturing method thereof.

FIGS. 14, 15, 16, 17, 18, 19, 20 and 21 are cross-sectional views showing an embodiment of a method of manufacturing the display device of FIG. 12. Hereinafter, any repetitive detailed descriptions of the same or like elements as those of the method of manufacturing the display device 10 described with reference to FIGS. 3, 4, 5, 6, 7, 8, 9, 10 and 11 will be omitted or simplified.

Figure 14:
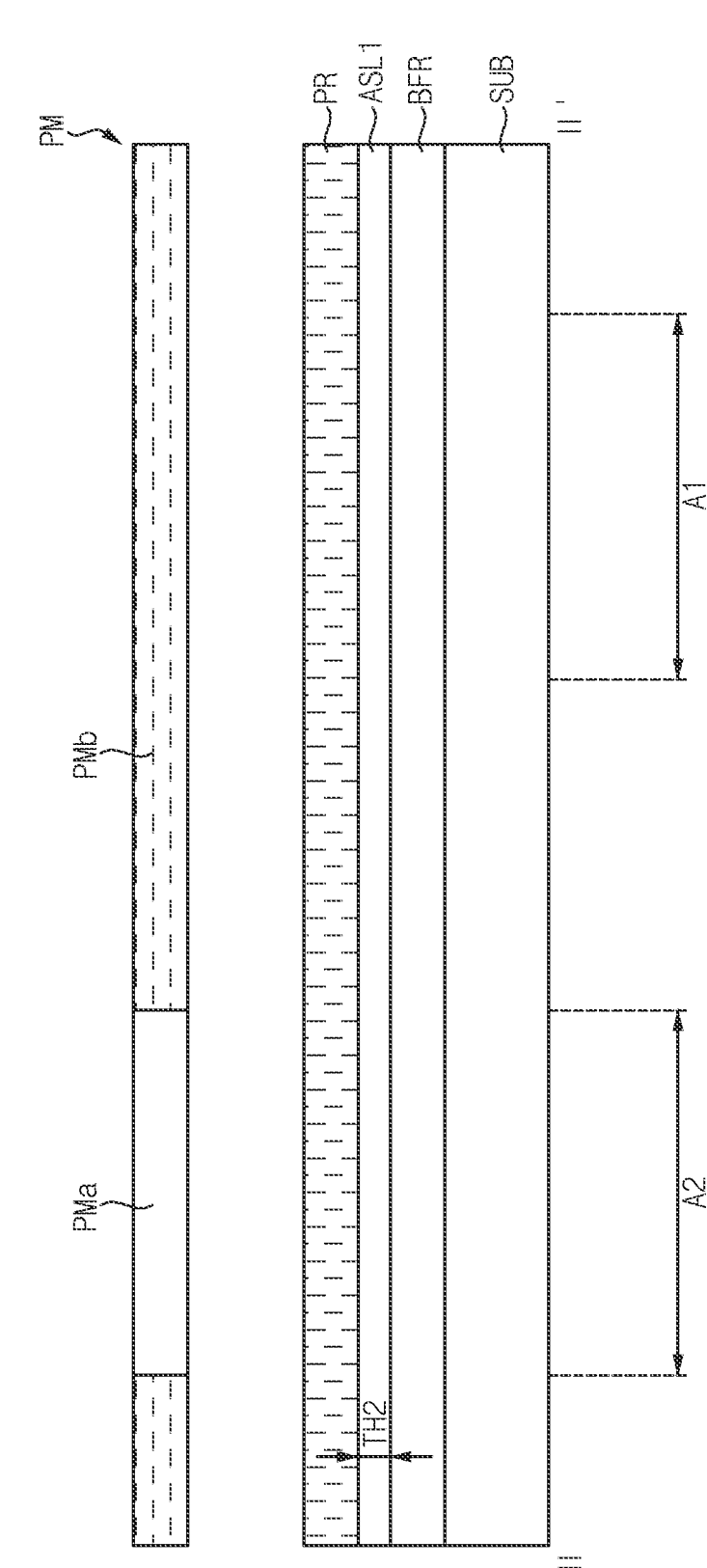
FIGS. 14, 15, 16, 17, 18, 19, 20 and 21 are cross-sectional views showing an embodiment of a method of manufacturing the display device of FIG. 12.

Referring to FIG. 14, the buffer layer BFR may be formed on the substrate SUB. A first amorphous silicon layer ASL1 may be formed on the buffer layer BFR. In an embodiment, the first amorphous silicon layer ASL1 may have a second thickness TH2. A photoresist layer PR may be formed on the first amorphous silicon layer ASL1. In an embodiment, the photoresist layer PR may include a negative-type photoresist.

A photomask PM may be provided or disposed on the photoresist layer PR. The photomask PM may include a light transmitting part PMa and a light blocking part PMb. When the photoresist layer PR includes the negative-type photoresist, the light transmitting part PMa may overlap a second area A2.

Figure 15:
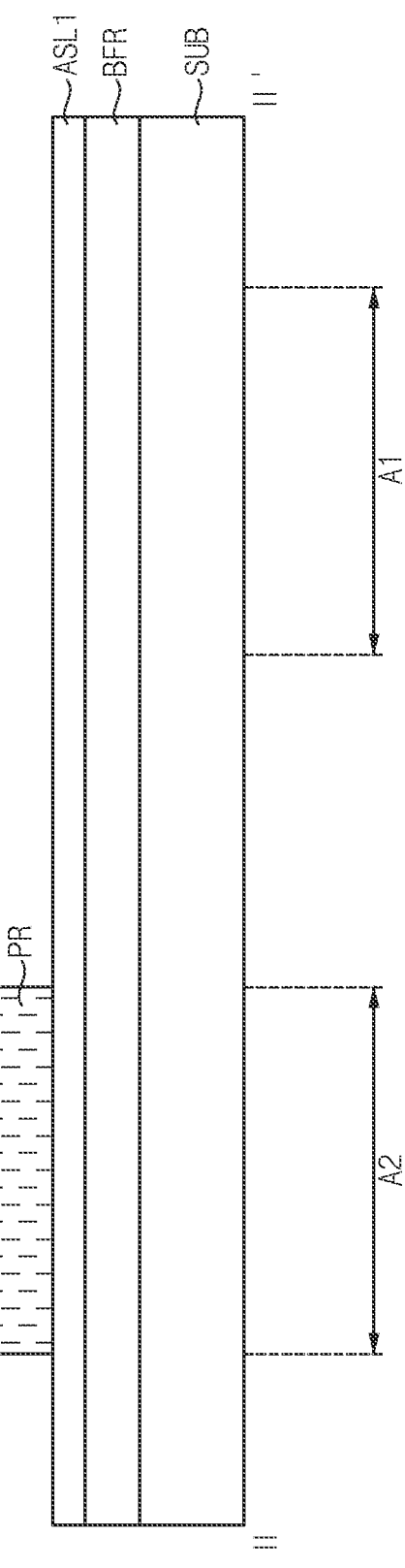

Referring to FIGS. 14 and 15, the first amorphous silicon layer ASL1 overlapping a first area A1 may be exposed by patterning the photoresist layer PR. In an embodiment, for example, the photoresist layer PR may be patterned by being exposed with light through the photomask PM and developed using a developing solution. Accordingly, the photoresist layer PR overlapping the light blocking part PMb may be removed. In such an embodiment, the photoresist layer PR overlapping the first area A1 may be removed.

Figure 16:
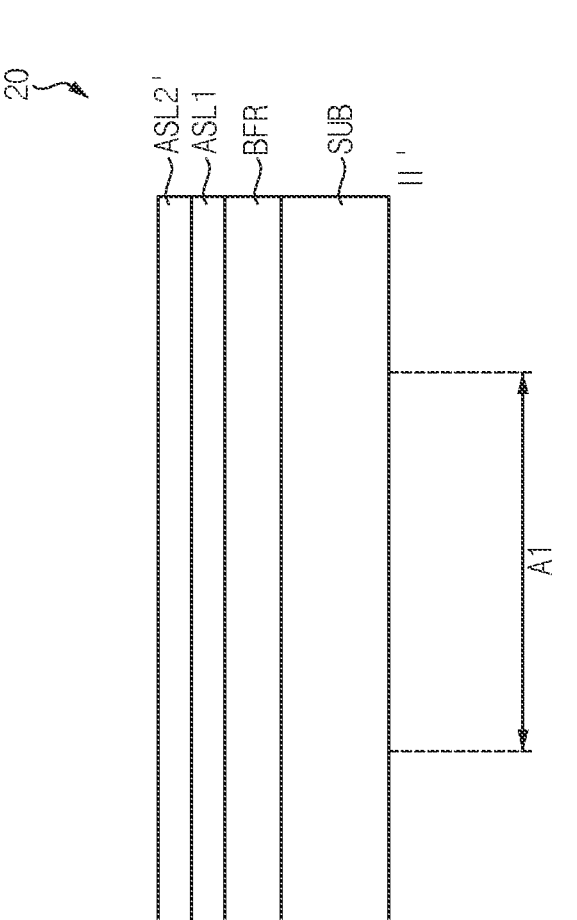

Referring to FIG. 16, a preliminary second amorphous silicon layer ASL2' may be formed on the first amorphous silicon layer ASL1 and the photoresist layer PR. The preliminary second amorphous silicon layer ASL2' may have a third thickness TH3. In an embodiment, the third thickness TH3 may be greater than 0 Å and less than about 200 Å.

Figure 17:
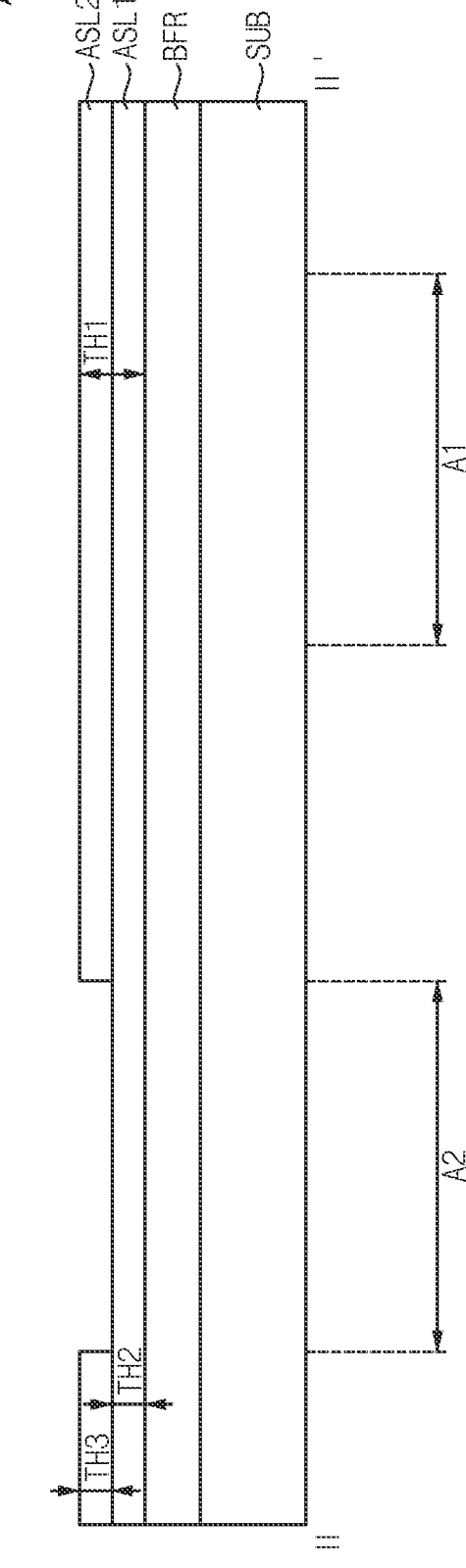

Referring to FIGS. 16 and 17, the preliminary second amorphous silicon layer ASL2' on the photoresist layer PR and the photoresist layer PR may be removed. In an embodiment, the preliminary second amorphous silicon layer ASL2' on the photoresist layer PR and the photoresist layer PR may be simultaneously removed. Accordingly, a second amorphous silicon layer ASL2 may be formed. In addition, the first amorphous silicon layer ASL1 overlapping the second area A2 may be exposed.

The second amorphous silicon layer ASL2 may have the same thickness as the preliminary second amorphous silicon layer ASL2'. That is, the second amorphous silicon layer ASL2 may have the third thickness TH3. In an embodiment, the third thickness TH3 may be greater than 0 Å and less than about 200 Å.

A first thickness TH1 may be a sum of the second thickness TH2 of the first amorphous silicon layer ASL1 and the third thickness TH3 of the second amorphous silicon layer ASL2. In an embodiment, the first thickness TH1 may be in a range of about 300 Å to about 500 Å.

Figure 18:
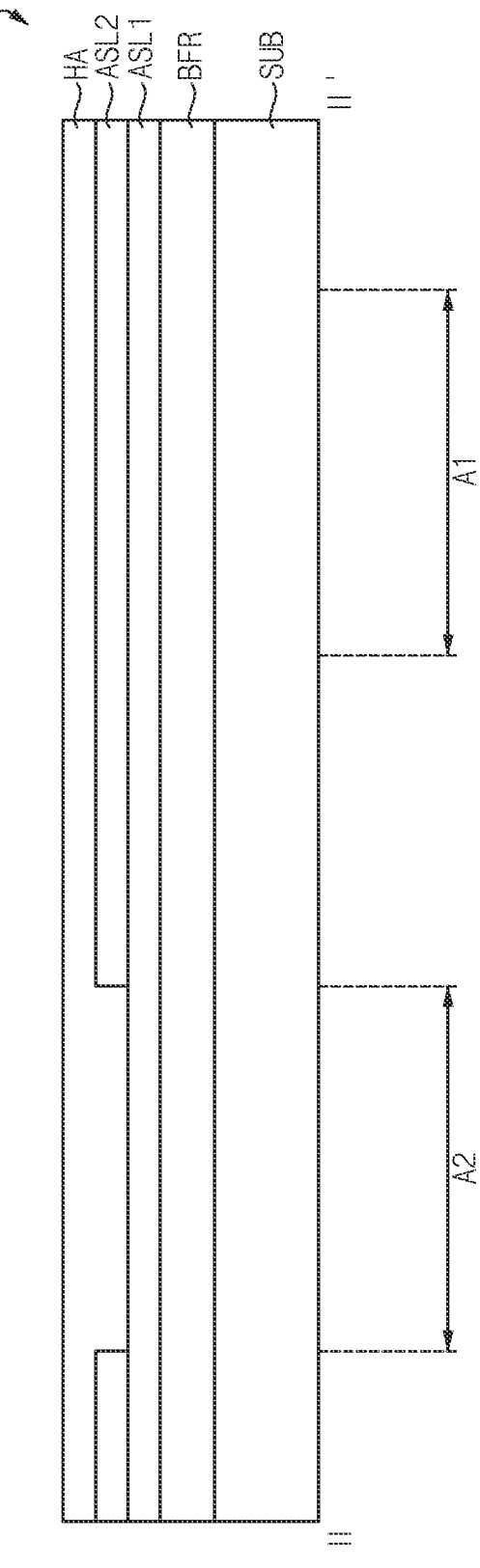

Referring to FIG. 18, the first amorphous silicon layer ASL1 overlapping the second area A2 and the second amorphous silicon layer ASL2 may be cleaned.

Figure 19:
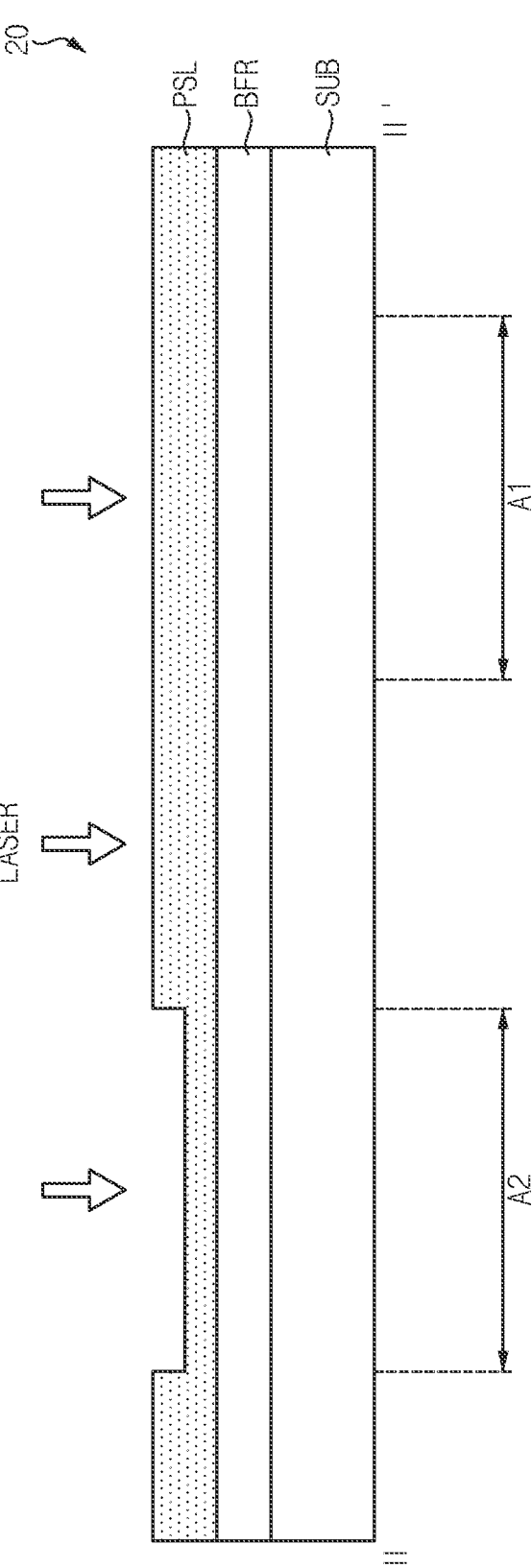

Referring to FIGS. 18 and 19, a polycrystalline silicon layer PSL may be formed by crystallizing the first amorphous silicon layer ASL1 and the second amorphous silicon layer ASL2. In an embodiment, the polycrystalline silicon layer PSL may be formed by radiating a laser to the first amorphous silicon layer ASL1 and the second amorphous silicon layer ASL2.

Figure 20:
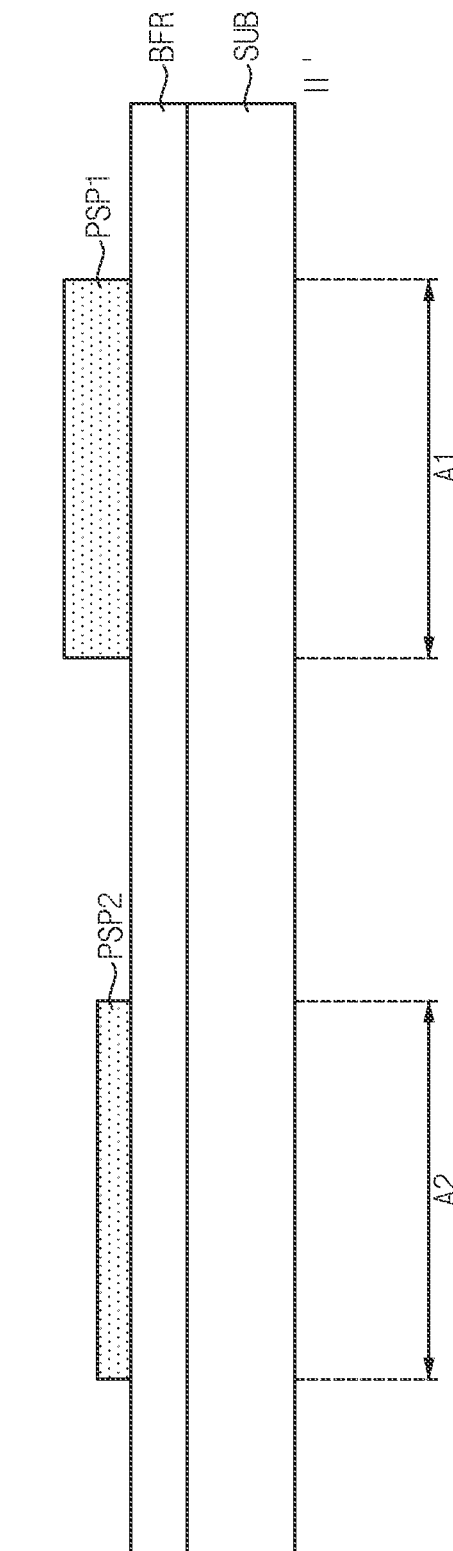

Referring to FIG. 20, in the polycrystalline silicon layer PSL, an area excluding an area overlapping the first area A1 and an area overlapping the second area A2 may be etched by the first thickness TH1. Accordingly, a first polycrystalline silicon pattern PSP1 overlapping the first area A1 and a second polycrystalline silicon pattern PSP2 overlapping the second area A2 may be formed.

Figure 21:
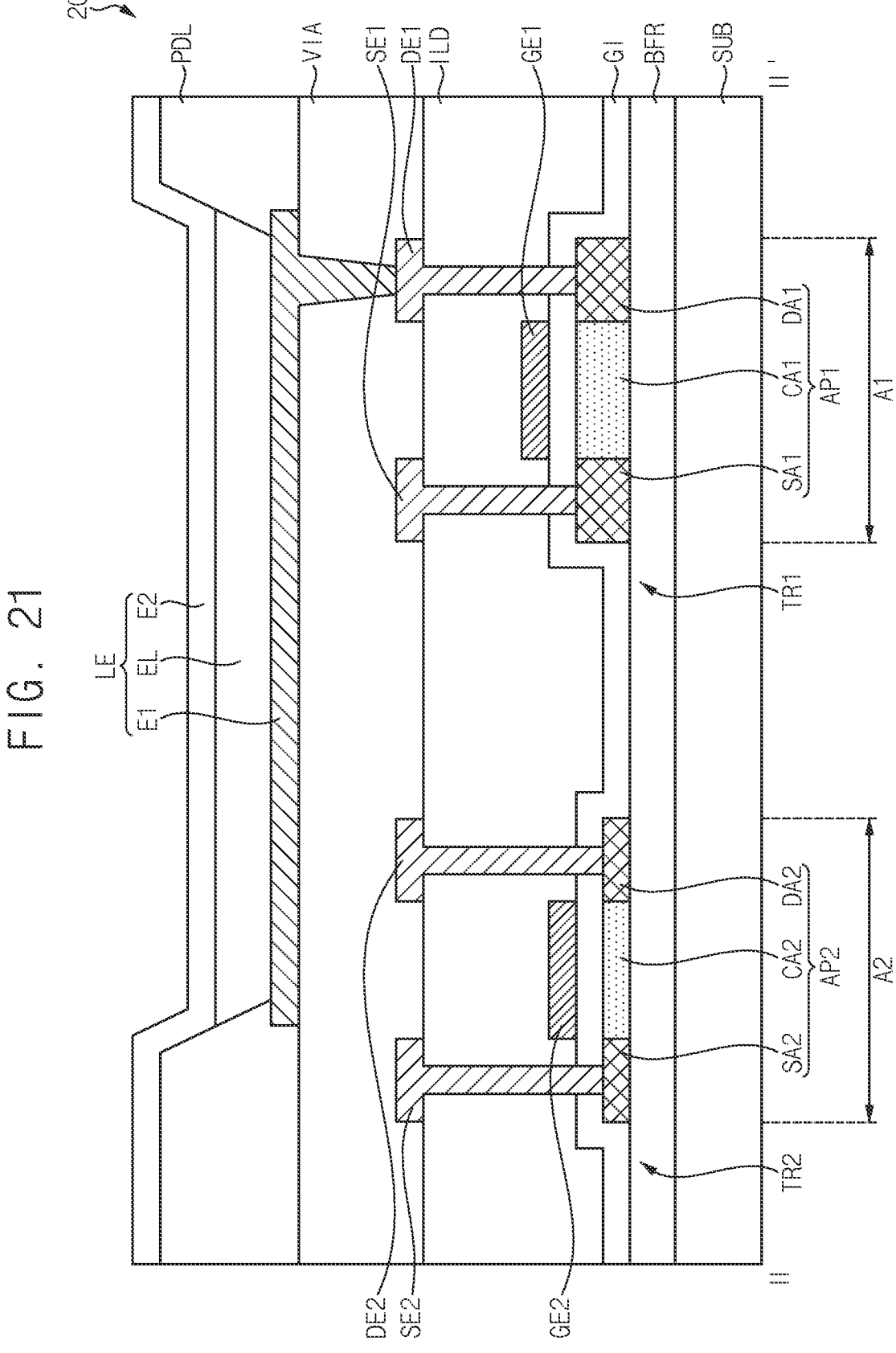

Referring to FIGS. 20 and 21, the gate insulating layer GI may be formed on the buffer layer BFR to cover the first polycrystalline silicon pattern PSP1 and the second polycrystalline silicon pattern PSP2. The first gate electrode GE1 and the second gate electrode GE2 may be formed on the gate insulating layer GI. In an embodiment, the first gate electrode GE1 may be formed to overlap the first polycrystalline silicon pattern PSP1 in the thickness direction. The second gate electrode GE2 may be formed to overlap the second polycrystalline silicon pattern PSP2 in the thickness direction.

Ions may be implanted into the first polycrystalline silicon pattern PSP1 and the second polycrystalline silicon pattern PSP2 to form the first active pattern AP1 and the second active pattern AP2, respectively.

The interlayer insulating layer ILD, the first source electrode SE1, the first drain electrode DE1, the second source electrode SE2, the second drain electrode DE2, the via insulating layer VIA, the first electrode E1, the pixel defining layer PDL, the light emitting layer EL, and the second electrode E2 may be sequentially formed on the gate insulating layer GI.

Embodiments of the disclosure can be applied to various display devices such as display devices for vehicles, ships and aircraft, portable communication devices, display devices for exhibition or information transmission, medical display devices, and the like, for example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:
    forming a first amorphous silicon layer on a substrate on which a first area and a second area are defined;
    forming a mask in the second area on the first amorphous silicon layer;
    forming a preliminary second amorphous silicon layer on the first amorphous silicon layer and the mask;

forming a second amorphous silicon layer by removing a portion of the preliminary second amorphous silicon layer on the mask;

removing the mask; and forming a polycrystalline silicon layer by crystallizing the first amorphous silicon layer and the second amorphous silicon layer.

2. The method of claim 1, wherein a thickness of the second amorphous silicon layer is less than about 200 Å.

3. The method of claim 1, wherein a sum of a thickness of the first amorphous silicon layer and a thickness of the second amorphous silicon layer is in a range of about 300 Å to about 500 Å.

4. The method of claim 1, wherein a thickness of the mask is greater than or equal to a thickness of the second amorphous silicon layer.

5. The method of claim 1, further comprising:

cleaning the first amorphous silicon layer and the second amorphous silicon layer.

6. The method of claim 1, wherein the portion of the preliminary second amorphous silicon layer on the mask and the mask are simultaneously removed.

7. The method of claim 1, further comprising:

forming a first polycrystalline silicon pattern and a second polycrystalline silicon pattern in the first area and the second area, respectively, by etching an area of the polycrystalline silicon layer except for areas corresponding to the first area and the second area, respectively.

8. The method of claim 7, further comprising:

forming a gate insulating layer on the substrate to cover the first polycrystalline silicon pattern and the second polycrystalline silicon pattern.

9. The method of claim 8, further comprising:

forming a first gate electrode overlapping the first polycrystalline silicon pattern and a second gate electrode overlapping the second polycrystalline silicon pattern on the gate insulating layer.

10. The method of claim 1, further comprising:

forming a buffer layer on the substrate.

11. A method of manufacturing a display device, the method comprising:

forming a first amorphous silicon layer on a substrate on which a first area and a second area are defined;

forming a photoresist layer on the first amorphous silicon layer;

exposing the first amorphous silicon layer overlapping the first area by patterning the photoresist layer;

forming a preliminary second amorphous silicon layer on the first amorphous silicon layer and a patterned photoresist layer;

forming a second amorphous silicon layer by removing a portion of the preliminary second amorphous silicon layer on the patterned photoresist layer;

removing the patterned photoresist layer; and forming a polycrystalline silicon layer by crystallizing the first amorphous silicon layer and the second amorphous silicon layer.

12. The method of claim 11, wherein a thickness of the second amorphous silicon layer is less than about 200 Å.

13. The method of claim 11, wherein a sum of a thickness of the first amorphous silicon layer and a thickness of the second amorphous silicon layer is in a range of about 300 Å to about 500 Å.

14. The method of claim 11, further comprising:

cleaning the first amorphous silicon layer and the second amorphous silicon layer.

15. The method of claim 11, wherein the portion of the preliminary second amorphous silicon layer on the photoresist layer and the patterned photoresist layer are simultaneously removed.

16. The method of claim 11, further comprising:

forming a first polycrystalline silicon pattern and a second polycrystalline silicon pattern in the first area and the second area, respectively, by etching an area of the polycrystalline silicon layer except for areas corresponding to the first area and the second area, respectively.

17. The method of claim 16, further comprising:

forming a gate insulating layer on the substrate to cover the first polycrystalline silicon pattern and the second polycrystalline silicon pattern.

18. The method of claim 17, further comprising:

forming a first gate electrode overlapping the first polycrystalline silicon pattern and a second gate electrode overlapping the second polycrystalline silicon pattern on the gate insulating layer.

19. The method of claim 11, further comprising:

forming a buffer layer on the substrate.

20. The method of claim 11, wherein the photoresist layer is a negative-type photoresist layer.

* * * * *